United States Patent
Ren et al.

(10) Patent No.: US 8,772,870 B2
(45) Date of Patent: Jul. 8, 2014

(54) LDMOS DEVICE WITH MINORITY CARRIER SHUNT REGION

(71) Applicants: Xiaowei Ren, Phoenix, AZ (US); David C. Burdeaux, Tempe, AZ (US); Robert P. Davidson, Chandler, AZ (US); Michele L. Miera, Gilbert, AZ (US)

(72) Inventors: Xiaowei Ren, Phoenix, AZ (US); David C. Burdeaux, Tempe, AZ (US); Robert P. Davidson, Chandler, AZ (US); Michele L. Miera, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/665,665

(22) Filed: Oct. 31, 2012

(65) Prior Publication Data

US 2014/0117446 A1   May 1, 2014

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC ........... 257/343; 257/338; 257/369; 438/133; 438/478

(58) Field of Classification Search
USPC ........... 257/207, 338, 343, 369; 438/133, 478
See application file for complete search history.

(56) References Cited

U.S. PATENT DOCUMENTS

| | | | |
|---|---|---|---|
| 7,268,045 B2 | 9/2007 | Hower et al. | |
| 7,491,586 B2* | 2/2009 | Horch et al. | 438/133 |
| 2005/0014349 A1* | 1/2005 | Carey et al. | 438/478 |
| 2005/0281119 A1* | 12/2005 | Shibata et al. | 365/230.06 |

OTHER PUBLICATIONS

Gordon Ma et al., "High Efficiency LDMOS Power FET for Low Voltage Wireless Communications," IEDM 96-91, 4 pages, IEEE 1996.
P. Hower et al., "A Rugged LDMOS for LBC5 Technology," Proceedings of the 17$^{th}$ International Symposium on Power Semiconductor Devices & IC's, pp. 327-330, May 23-26, 2005, Santa Barbara, CA.
White paper, "50 V RF LDMOS, An ideal RF power technology for ISM, broadcast and commercial aerospace applications," freescale.com/RFpower, Freescale Semiconductor, Inc., 13 pages (Sep. 2011).

* cited by examiner

*Primary Examiner* — Phuc Dang
(74) *Attorney, Agent, or Firm* — Lempia Summerfield Katz LLC

(57) ABSTRACT

A device includes a semiconductor substrate, source and drain regions in the semiconductor substrate and having a first conductivity type, a gate structure supported by the semiconductor substrate between the source and drain regions, a well region in the semiconductor substrate, having a second conductivity type, and in which a channel region is formed under the gate structure during operation, and a shunt region adjacent the well region in the semiconductor substrate and having the second conductivity type. The shunt region has a higher dopant concentration than the well region to establish a shunt path for charge carriers of the second conductivity type that electrically couples the well region to a potential of the source region.

20 Claims, 3 Drawing Sheets

LDMOS DEVICE WITH MINORITY CARRIER SHUNT REGION

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in some applications. Some power transistor devices are also designed to handle radio frequency (RF) signals, such as the devices used in wireless communications and other RF power amplifier applications. One type of RF power transistor device is a laterally diffused metal-oxide-semiconductor (LDMOS) transistor. In an LDMOS device, charge carriers drift through a drift space between a channel region and the drain electrode under the electric field arising from an operating voltage applied between the source and drain electrodes.

The high operating voltages between the source and drain electrodes of an LDMOS device may give rise to the generation of minority carriers through impact ionization. If a sufficient number of minority carriers are present in the channel region, the junction between the channel region and the source region of the LDMOS device can act as a base-emitter junction of a parasitic bipolar transistor. Destructive levels of current may occur in a condition referred to as "snapback," if the parasitic bipolar transistor turns on.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
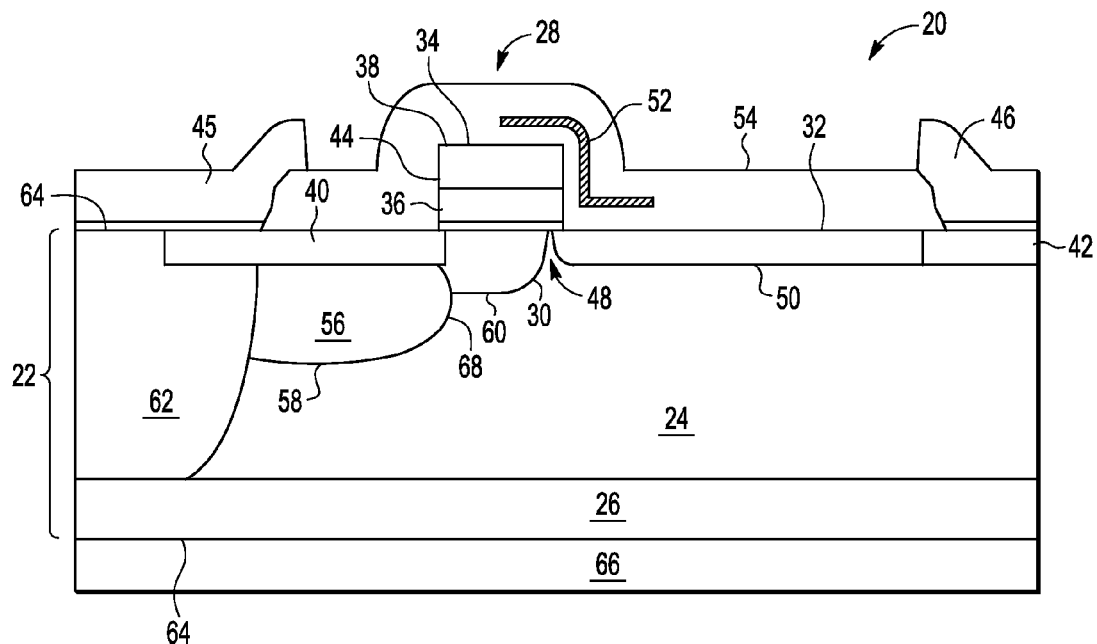
FIG. 1 is a cross-sectional, schematic view of an exemplary LDMOS transistor having a minority carrier shunt region configured in accordance with one embodiment.

Embodiments of an LDMOS transistor device having a minority carrier shunt region are described. Methods of fabricating such devices are also described. During operation of an LDMOS transistor device (e.g., RF LDMOS transistor device), instantaneous conditions may lead to triggering of a destructive snapback event. The presence of the shunt region, as described below, may suppress the onset of the snapback effect by controlling or preventing turn on of the parasitic bipolar transistor. The presence and other characteristics of the shunt region may be optimized to have minimal, if any, impact on the performance characteristics useful for RF operation. Thus, the shunt region may improve the ruggedness or robustness of an LDMOS device without introducing detriments to performance. For example, the disclosed device embodiments may be more robust despite the absence of either DC and/or RF performance tradeoffs, such as a higher device turn-on voltage, increased parasitic capacitance, and/or reduced linearity, output power, gain, or efficiency. In contrast, other ways to improve the ruggedness performance of the LDMOS device, such as an adjustment of a lateral extension of a drift region and/or shielding, or the placement of a latch-up layer under the gate, or the reduction of the substrate thickness, may introduce significant DC and/or RF performance degradations. Such performance degradations may occur to a much lower degree, if at all, with the presence of the shunt region of the various LDMOS device embodiments discussed herein.

The shunt region may be configured to collect minority carriers produced from impact ionization during, e.g., avalanche conditions in a drain region. Such minority carriers may otherwise be injected into a base region of the parasitic bipolar transistor. Collecting such carriers may prevent the parasitic bipolar transistor from turning on (i.e., the snapback effect). Catastrophic failure during transistor operation may thus be avoided or prevented.

The shunt region may be fabricated via a heavier implant (e.g., heavier than an implant for a region in which a channel is formed) on a source-side of a gate of the disclosed devices. The implant may be configured to dispose the shunt region close or closer to the gate without extending under the gate (e.g., closer to the gate than a sinker region of the device). The shunt region may be under a source region. The implant may be configured to reach into a semiconductor substrate to a depth equal to or deeper than a region in which a channel is formed. The positioning and doping of the shunt region may reduce the effective resistance of a base of the parasitic bipolar transistor without adversely affecting LDMOS performance. The lowered resistance effectively lowers the bias voltage applied to the base. Shunting the minority carriers away from the base-emitter junction of the bipolar transistor may help avoid a snapback condition arising from activation of the parasitic bipolar transistor.

The shunt region of the disclosed devices and methods may support the use of LDMOS devices (e.g., RF LDMOS devices) in applications calling for higher power levels, higher gain levels, larger bandwidth, and/or faster rising/falling signals than those supported by conventional devices. Without the device arrangements described below, such higher gains may otherwise lead to a higher beta value for the parasitic bipolar device, thereby making the conditions encountered by the LDMOS transistor in RF applications more likely to trigger a snapback. Such higher power levels may otherwise more easily lead to avalanche conditions in which the minority carriers are produced for parasitic device activation. Such larger bandwidths may otherwise lead to more signal spikes, which may otherwise more easily lead to avalanche conditions. Voltage spikes may also arise from fast rising/falling signals. The onset of snapback arising from these and other operating conditions may be avoided via the shunt region of the disclosed embodiments of devices and methods.

Although described below in connection with n-channel LDMOS transistors, the disclosed devices are not limited to any particular transistor configuration. N-channel LDMOS devices are described and illustrated herein for convenience of description and without any intended limitation. The disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

FIG. 1 is a schematic cross-sectional view of an example of an n-channel LDMOS device 20 constructed in accordance with one embodiment. The device 20 may be configured for operation as an RF LDMOS transistor device. The device 20 includes a semiconductor substrate 22, which may, in turn, include a number of epitaxial layers 24. In this example, the semiconductor substrate 22 includes a single p-type epitaxial layer grown on an original substrate 26. The original substrate 26 may be a heavily, moderately, or lightly doped p-type substrate in some cases, such as those having multiple epitaxial layers. The device 20 may alternatively or additionally include non-epitaxial layers in which one or more device regions are formed. Any one or more of the layers of the semiconductor substrate 22 may include silicon. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 28 is depicted in FIG. 1. The device area 28 may include or correspond with one or more active areas of the device 20. In some embodiments, the device area 28 is defined by one or more doped isolating regions (not shown) in the semiconductor substrate 22 (e.g., the epitaxial layer 24). The doped isolating region(s) may surround the device area 28. These regions act as a barrier separating the device area 28 from other portions of the substrate 22 (or the original substrate 26). For example, the device area 28 may be further defined via a moderately or heavily doped n-type isolating well laterally surrounding the device area 28. The isolating well may be ring-shaped. The device area 28 may alternatively or additionally be defined by one or more isolation regions, such as a shallow trench isolation (STI) region.

The device 20 includes a well or diffused region 30 in the semiconductor substrate 22. During operation, a channel or channel region is formed in the well region 30 at a surface 32 of the semiconductor substrate 22. The channel region is formed under a gate structure 34 of the device 20 via application of a bias voltage to a conductive portion (e.g., polysilicon layer) of the gate structure 34. The well region 30 may be a region formed by lateral diffusion under the gate structure 34. The well region 30 may be considered a body or base region of the device 20. In this example, the well region 30 is a p-type well formed in the epitaxial layer 24 of the semiconductor substrate 22. The p-type well may be configured for high voltage operation or other operational conditions in typical RF applications. The well region 30 may be configured to establish a desired threshold voltage and/or other operational parameters of the device 20. For example, the dopant concentration level and the depth of the well region 30 may be configured to set the threshold voltage.

The gate structure 34 is formed on or above the semiconductor substrate 22 over the well region 30. The gate structure 34 includes an oxide or other dielectric layer disposed on the surface 32. For example, the dielectric layer may include silicon dioxide (or oxide) deposited or otherwise formed on the surface 32. The gate structure 34 may include any number of dielectric layers. The dielectric layer spaces a polysilicon or other conductive layer 36 of the gate structure 34 from the well region 30. One or more metal interconnect layers 38 may, in turn, be disposed on the polysilicon layer 36. The materials, shape, construction, and other characteristics of the gate structure 34 may vary. For example, the lateral extent to which the well region 30 extends under the gate structure 34 may vary from the example shown. The gate structure 34 may include additional components. For example, the gate structure 34 may include one or more dielectric sidewall spacers disposed along lateral edges of the gate structure 32. The sidewall spacers may cover the lateral edges to act as a silicide block to prevent a silicide short along the surface 32. The sidewall spacers may provide spacing to separate the conductive components of the gate structure 34 from other structures or components of the device 20. One or more of the sidewall spacers may alternatively or additionally be used for alignment purposes in defining an edge of one or more regions of the device 20. The edges of one or more other regions may be aligned with the gate structure 34 as described below.

The configuration of the gate structure 34 may vary. For example, the gate structure 34 may include multiple conductive layers (e.g., polysilicon plates). The components, materials, and other characteristics of the gate structures 34 may vary from the example shown. For example, the device 20 may include multiple gate structures.

The device 20 includes heavily doped source and drain regions 40 and 42 in the semiconductor substrate 22. The source and drain regions 40 and 42 are laterally spaced from one another at the surface 32 of the semiconductor substrate 22. The gate structure 34 is supported by the semiconductor substrate 22 between the sources and drain regions 40, 42. The source region 40 may be disposed along or aligned with a sidewall 44 of the gate structure 34. In some embodiments, the source and drain regions 40 and 42 may have additional or alternative lateral spacing. Any number of source or drain regions 40, 42 may be provided. For example, the drain region 42 may be centered or otherwise disposed between, or laterally surrounded by, two portions of the source region 40 or two separate source regions. For example, the device 20 may be configured as a single transistor with a dual gate finger configuration. In this example, the source and drain regions 40 and 42 are n-type doped portions of the epitaxial layer 24. The heavily doped n-type source region 40 is adjacent the well region 30. The heavily doped n-type drain region 42 is spaced from the source 40 and the well 30. Such spacing defines a conduction path of the device between the source and drain regions 40, 42. The regions 40, 42, or a portion thereof, may have a dopant concentration at a level sufficient to establish ohmic contacts with electrodes or interconnects 45, 46, for biasing or applying voltages to the source region 40 and the drain region 42, respectively. During operation, the drain region 42 may be biased or otherwise disposed at a relatively high drain-source voltage, Vds, relative to the source region 40.

When the gate structure 34 is biased, charge carriers (in this case, electrons; alternatively, holes) accumulate in a region at or near the surface 32 under or below the gate structure 34, thereby forming a channel that electrically couples the source region 40 and the drain region 42. The channel region is located in the well region 30 and other p-type portions of the semiconductor substrate 22 under the gate structure 34. The accumulation of charge carriers (e.g., electrons) results in a majority charge carrier inversion in the channel region from the p-type well region 30 (or epitaxial layer 24) to an n-type conduction layer or area near the surface 32 of the semiconductor substrate 22. Once a sufficient amount of the charge carriers (e.g., electrons) accumulate in the channel region, charge carriers (e.g., electrons) are capable of flowing along a conduction path from the source region 40 to the drain region 42.

The channel region is not limited to areas within the well region 30 or body region of the device 20. For instance, charge carriers may accumulate in an area 48 near the surface 32 in a region of the epitaxial layer 24 adjacent the well region 30. A portion of the epitaxial layer 24 may be disposed between the well region 30 and an n-type well or drift region described below (e.g., when the well region 30 does not touch or abut the n-type well or drift region as shown).

The conduction path or regions of the device 20 may include still other regions, whether n-type or p-type, at or near the surface 32. For instance, the channel region and/or other conduction region of the device 20 may include one or more lightly or intermediately doped n-type transition regions in the semiconductor substrate 22. For example, the drain region 42 may include or be disposed adjacent to a lightly doped extension region.

The conduction path may include other regions or areas in the semiconductor substrate 22 in which charge accumulation occurs as a result of the bias applied to the gate structure 34. The conduction path of the device 20 is not limited to regions in which majority charge carrier inversion occurs or to regions in which conduction is enabled or enhanced via the bias voltage applied to the gate structure 34. In this example, charge carriers also gather along the surface 32 in an accumulation region outside of or beyond the well region 30. The gate structure 34 may extend over the accumulation region to a varying extent.

The device 20 includes a drift region 50 in the semiconductor substrate 22 between the well region 30 and the drain region 42. In this example, the drift region 50 is established via the formation of an n-type well. The n-type well may be configured for high voltage device operation, and may thus be referred to as an n-type high-voltage (NHV) well. For example, the drift region 50 may have a dopant concentration lower than the dopant concentration of the source and drain regions 40, 42 to support such high voltage device operation. The drift region 50 may support the creation of the accumulation region under the gate structure 34. In this example, the drift region 50 extends under a drain-side portion or edge of the gate structure 34. The drift region 50 laterally extends from the drain-side edge of the gate structure 34 to the drain region 42, which may be formed in or otherwise on the drift region 50. The lateral extension of the drift region 50 allows charge carriers (e.g., electrons) in the channel region to reach the drain region 42 during operation. The lateral extent of the drift region 50 may vary. For example, the size of the area 48 between the well region 30 and the drift region 50 may vary. The depth, size, and other characteristics of the drift region 50 may vary.

The device 20 may include a Faraday or other shield 52 disposed along or over a portion of the drift region 50 and a drain-side edge or sidewall of the gate structure 34. The shield 52 may include one or more field plates that extend over a portion of the gate structure 34 and/or the drift region 50. The device 20 may include one or more passivation layers 54 covering the surface 32. In some cases, the shield 52 is disposed between two of the passivation layers 54. The shield 52 may help protect the dielectric layer of the gate structure 34 from damage or degradation arising from charge carriers accelerated under the electric field arising from the drain-source voltage. The shield 52 may also help to reduce the maximum electric field in the drift region 50. The shield 52 may be grounded or otherwise biased to deter injection of such hot carriers into the oxide or other dielectric material under the gate structure 34 and/or the oxide or other dielectric material over the drift region 50.

The acceleration of charge carriers during operation may also lead to the creation of minority charge carriers in the semiconductor substrate 22. In this n-type channel example, high energy electrons may create electron-hole pairs through impact ionization with the semiconductor substrate 22 in the drain region 42, the drift region 50, or other area or region along the conduction path. If enough such impact ionization occurs, then avalanche breakdown in the semiconductor substrate 22 may occur. Such impact ionization may also lead to activation of the parasitic bipolar transistor present in the device 20. The minority charge carriers, in this case, holes, created by the impact ionization may produce sufficient base current to turn on the parasitic bipolar transistor. Once activated (i.e., once the snapback effect occurs), if the device 20 lacked various features described in more detail below, the parasitic bipolar transistor may otherwise cause a destructive level of current to flow through the device 20. The emitter, base, and collector of the parasitic bipolar transistor correspond with the source region 40, the well region 30, and the drift region 50, respectively, as shown in the representative circuit schematic of FIG. 2.

With reference again to FIG. 1, the device 20 includes a shunt region 56 to establish a shunt path for the minority charge carriers to protect the device 20 from the potentially destructive snapback current. The shunt region 56 is configured to lower an effective resistance Rb (FIG. 2) that biases the base of the parasitic bipolar transistor. The shunt region 56 is located in the semiconductor substrate 22 to position the shunt path so that the minority carriers present in the well region are directed away from the channel region at the surface 32, as well as the base and base-emitter junction of the parasitic bipolar transistor. The shunt region 56 is electrically coupled to, and disposed adjacent to, the well region 30 and a sinker region 62. In this example, the shunt region 56 is formed via an implantation procedure configured to establish a position (e.g., deep relative to the well region 30) and heavy (e.g., p+) dopant concentration level of the shunt region 56. The shunt region 56 may thus be configured as a "deep p+" region. Further details regarding exemplary depths, positioning, and dopant concentration levels of the shunt region 56 are provided below. The shunt region 56 and the well region 30 may be formed via laterally overlapping implantation procedures.

The shunt region 56 may be configured as a deep well to lead the minority carriers away from the channel region, the base, and the base-emitter junction. For example, the shunt region 56 may be disposed at a depth below the source region 40. In the embodiment of FIG. 1, the shunt region 56 has a bottom (or lower boundary) 58 deeper than a bottom 60 of the well region 30. In one example, the bottom 60 of the well region 30 is at about 4000 Å below the surface 32, while the depth of the bottom 58 of the shunt region 56 falls in a range from about 5000 Å to about 8000 Å below the surface 32 to sufficiently space the shunt path from the base-emitter junction. The shunt region 56 may also be disposed under the source region 40 such that the shunt path extends under the source region 40. The shunt path may extend laterally under the source region 40 or be otherwise laterally oriented. Laterally oriented shunt paths include those paths in which a flow of minority charge carriers is primarily or substantially lateral across the shunt region 56.

The shunt region 56 may be configured to establish the relatively low resistivity of the shunt path. For example, the shunt region 56 may have a higher dopant concentration than the well region 30. In some cases, the shunt region 56 may include a highly doped well having a dopant concentration level that falls in a range from about $1\times10^{18}/cm^3$ to about $5\times10^{20}/cm^3$.

The shunt region 56 has a conductivity type in common with the well region 30 to establish the shunt path. In this example, the shunt region 56 is configured as a p-type well to electrically couple the well region 30 to a potential of the source region 40. In this example, the shunt region 56 is adjacent, and electrically coupled, to a sinker region 62 of the device 20, which, in turn, is coupled to the source electrode 45. The sinker region 62 may be configured to extend from an Ohmic contact 64 with the source electrode 45, through the epitaxial layer 24, to reach the original semiconductor substrate 26. The sinker region 62 may be configured as a relatively heavily doped, p-type region to establish an electrical connection between the source electrode 45 (and, thus, the source region 40) and a backside or back surface 64 of the semiconductor substrate 22 on which a backside contact 66 (e.g., formed of metal or other conductive material) is deposited or otherwise disposed. The backside contact 66 may form an Ohmic contact with the original substrate 26 to complete the electrical connection between the source region 40, the shunt region 56, and the backside contact 66. The shunt region 56 may thus establish a shunt path between the well region 30 and the backside contact 66, which may bias the source region 40 at ground or any other potential. The shunt region 56 may be coupled to the potential of the source region 40 via alternative or additional regions and/or structures. For example, one or more conductive vias or other interconnects may be used to couple the shunt region to the source potential.

The shunt region 56 may be configured to avoid detrimental effects on the performance of the device 20. In this example, the shunt region 56 is not disposed under the gate structure 34. A vertical boundary of the shunt region 56 may be aligned with the source-side edge or sidewall 44 of the gate structure 34, as shown in FIG. 1. Alternatively, the vertical boundary of the shunt region 56 may be laterally spaced from the position of the source-side edge or sidewall 44. Such spacing may arise from a spacer at the surface 32 of the semiconductor substrate 22, as shown and described in connection with the embodiment of FIG. 4. In these and other cases, the shunt region 56 is spaced from the position of a source-side corner of the gate structure 34 at which the sidewall 44 meets the surface 32 of the semiconductor substrate 22. Such spacing may avoid detrimentally increasing a parasitic capacitance Cds of the device 20 and/or the threshold voltage Vt of the device 20.

Even though use of the gate structure 34 for alignment may provide an accurate or precise placement of the shunt region 56 relative to the gate structure 34, the shunt region 56 may also be shaped to avoid detrimental changes to the parasitic capacitance Cds or the threshold voltage Vt. For instance, the shunt region 56 may be shaped to avoid diffusion or other effects that may otherwise lead to the shunt region 56 extending under the gate structure 34. In some embodiments, the shunt region 56 may have a shape configured via an angled implant. For example, the angle of the implant may cause the shunt region 56 to be narrower in the horizontal direction, along the interface with the source region 34 than the shunt region 56 is below the interface, and, thus, the vertical boundary of the shunt region 56 at the interface may be laterally spaced from the source-side corner of the gate structure 34. The gate structure 34 may function as a mask during the shunt region implant, with the angle of the implant causing a shadow effect at shallower depths. Alternatively, a masking layer may be used to offset the implant from the edge of the gate structure 34. In the embodiment of FIG. 1, the shunt region 56 has a profile that includes a side or edge 68 that extends farther toward (or beyond) the gate structure sidewall 44, in the lateral direction, with increasing depth. The width of the shunt region 56 may increase until the edge of the gate structure 34 is reached or until the bottom 60 of the well region 30 is reached.

The device 20 is shown in simplified form in FIG. 1. For example, FIG. 1 does not show a number of metal layers configured for electric connections with the source region 40, the drain region 42, and the gate structure 34. The device 20 may have a number of other structures or components for connectivity, isolation, passivation, and other purposes not shown in FIG. 1 for ease in illustration. For instance, the device 20 may include any number of isolating regions or layers. Any number of shallow trench isolation (STI) regions may be formed at the surface 32 of the semiconductor substrate 22. Other STI regions may be disposed in the semiconductor substrate 22 to isolate or separate various contact regions. One or more further STI regions, other isolation trenches, and/or isolation wells (not shown) may be provided to isolate the device area 28 and/or active area of the device 20. In some examples, another p-type epitaxial layer may be disposed between the original substrate 26 and the surface 32 of the semiconductor substrate 22 in the device area 28.

The device 20 may be configured with one or more lightly or intermediately doped transition regions (e.g., n-type lightly doped drain, or NLDD, regions) at or near the source and drain regions 40 and 42. Each transition region may be or include a diffused region formed in connection with the source region 40 and/or the drain region 42 and may be, thus, referred to herein as a source/drain extension region. Such transition regions may assist in controlling the electric field at or near the surface 32, including in areas other than those areas near the source region 40 or the drain region 42.

The dopant concentrations, thicknesses, and other characteristics of the above-described semiconductor regions in the semiconductor substrate 22 may vary. For example, the dopant concentration of the original substrate 26 may vary considerably. The dopant concentrations and/or depths may have values larger or smaller than the values or ranges provided herein.

Figure 2:
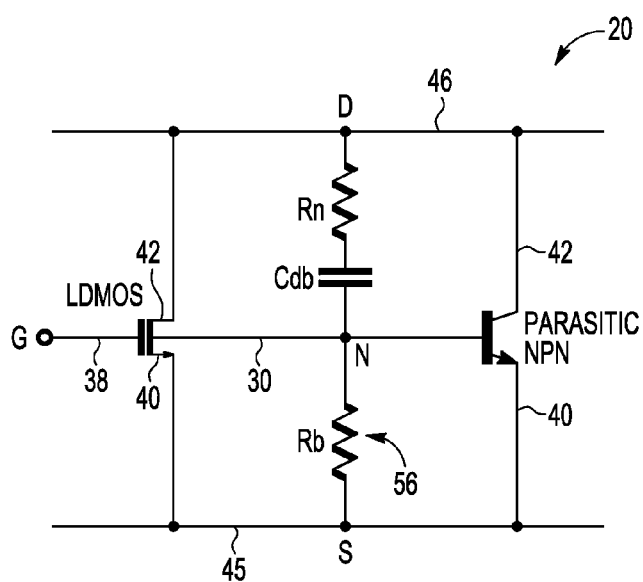
FIG. 2 is a circuit diagram representative of the LDMOS transistor of FIG. 1 with the minority carrier shunt region represented by a base resistance of a parasitic bipolar transistor.

FIG. 2 depicts a circuit schematic representation of the device 20. In operation, a gate voltage G is applied to the conductive layer 38 of the gate structure 34 (FIG. 1), while the drain-source voltage $Y_{DS}$ is applied across the source and drain electrodes 45, 46. Resistances Rn and Rb form a voltage divider to set the voltage at a node N that acts as the base of a parasitic NPN transistor presented via the source and drain regions 40, 42 and the well region 30. To avoid turning on the NPN transistor, the shunt path established via the shunt region 56 lowers the base voltage by lowering the resistance Rb, e.g., by shorting the node N to the voltage at the source electrode 45. Lowering the resistance Rb redirects the minority charge carriers in the well region 30 to the source electrode 45 and away from the parasitic NPN transistor, thereby reducing the forward bias on the base-emitter junction of the parasitic NPN transistor and the probability of triggering a snapback event.

Figure 3:
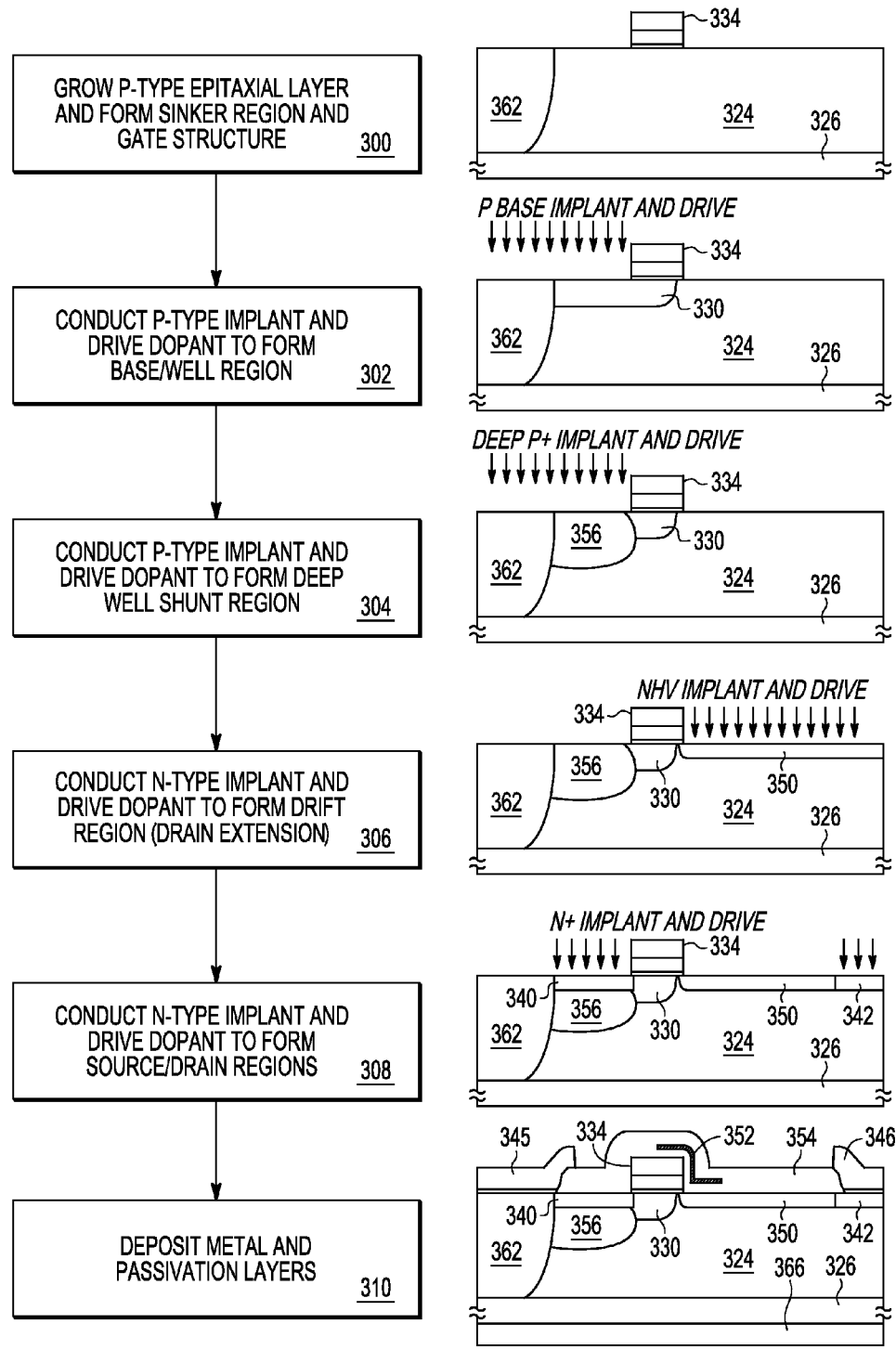
FIG. 3 is a process flow diagram and corresponding schematic, cross-sectional views illustrating an exemplary fabrication sequence to construct an LDMOS transistor having a minority carrier shunt region in accordance with one embodiment.

FIG. 3 shows an exemplary fabrication method for fabricating a device with a shunt region configured as described above. The transistor device is fabricated with a semiconductor substrate, the regions or layers of which may have the conductivity types of the n-channel examples described above, or be alternatively configured to support a p-channel device. The method includes a sequence of acts or steps, only the salient of which are depicted for convenience in illustration. The ordering of the acts may vary in other embodiments. For example, a drift region doping step 306 may be implemented after a source/drain doping step 308. The fabrication method is not limited to any particular doping mechanism, and may include future developed doping techniques.

The method may begin with, or include, a step 300 in which a p-type epitaxial layer 324 is grown on a p-type original semiconductor substrate 326. In some cases, the step 300 includes the formation via, e.g., ion implantation, of a sinker region 362 and one or more buried isolating layers (not illustrated) in or below the epitaxial layer. The sinker region may be formed during the growth of the epitaxial layer. Alternatively, the sinker region may be formed via an implant configured to extend through the epitaxial layer to reach the original semiconductor substrate. Any number of epitaxial layers may be grown.

After all of the epitaxial growth is complete, a gate structure 334 of the transistor device is formed on a surface of the semiconductor substrate. The formation of the gate structure may include the deposition or growth of a gate oxide layer and one or more conductive gate layers (e.g., a polysilicon layer and a silicide layer on the polysilicon layer), as well as patterning (e.g., etching) of such layers.

A photoresist layer and/or the gate structure is then used as a mask in a dopant implant procedure conducted in a step 302. The implant is configured to form a base or well region 330 in the semiconductor substrate. The step 302 includes a drive procedure to allow the well region 330 to extend a desired lateral distance under the gate structure via lateral diffusion. The drive procedure may be configured to establish the characteristics of a channel region formed during operation.

Figure 4:
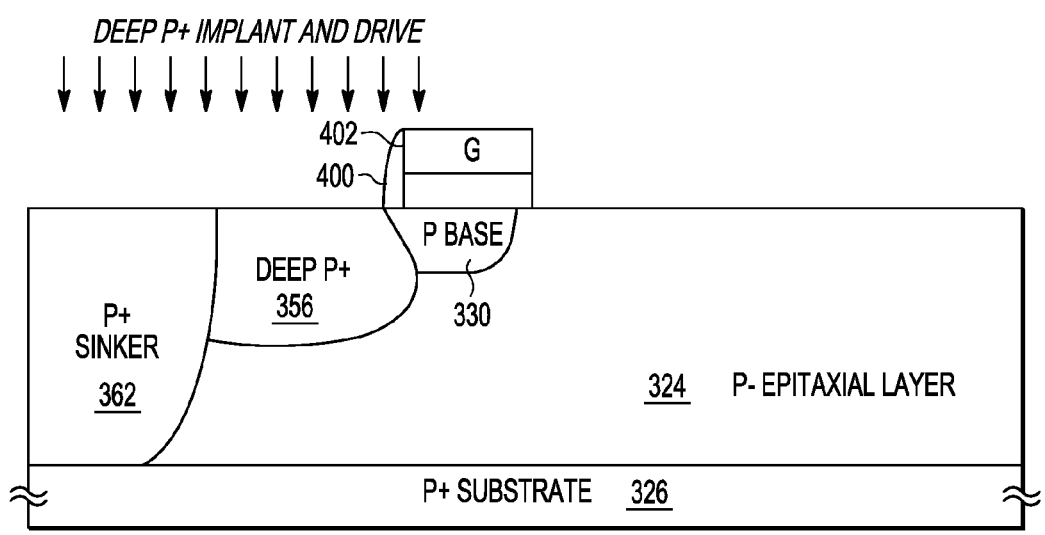
FIG. 4 is a cross-sectional, schematic view of an LDMOS transistor device during a fabrication sequence configured in accordance with another embodiment.

As shown in FIG. 4, the method may also include the deposition of a spacer 400 along a source-side sidewall 402 of the gate structure. In some embodiments, the spacer 400 is formed after the well region is formed in the step 302. The presence of the spacer 400 may be used to position the shunt region relative to the source-side sidewall 402. The construction, material, shape, and other characteristics of the spacer 400 may vary. For example, the spacer 400 may be a temporary structure, such as a photoresist or other structure.

In step 304, another implant procedure is conducted to dope a deep well to form the shunt region 356 in the semiconductor substrate adjacent the well region 330. In one example, the shunt region 356 is formed via implant and drive procedures configured such that the shunt region has a bottom deeper than a bottom of the well region. The gate structure 334 (including any spacer) may again be used as a mask for the implant procedure to align the shunt region 356 with the gate structure 334, or alternatively another masking layer may be used. The opening for the implant procedure may overlap with the sinker region 362 as shown. In some cases, the implantation of dopant is conducted at an angle with respect to vertical to space the shunt region 356 from a source-side corner or sidewall of the gate structure 334.

In one embodiment, the energy of the implant procedure to form the shunt region 356 falls in a range from about 40 KeV to about 200 KeV. The implant energy may vary. For example, the implant energy may be adjusted to accommodate different implant energies for the well region 330 and other regions of the device.

The implant procedure to form the shunt region 356 may be configured to establish a relatively moderate or high dopant concentration level. As described above, the shunt region 356 may have a higher dopant concentration than the well region 330 to establish a shunt path away from the well region in which the channel is formed. For example, a high dose implant may be used to reach concentration levels in the shunt region 356 that fall in a range from about $1\times10^{18}/cm^3$ to about $5\times10^{20}/cm^3$. Such levels may or may not be achieved in procedures configured for MeV energies levels. The various dopant concentration levels, and the location of these dopants, may impact the behavior of the parasitic NPN transistor.

In a step 306, the substrate is doped to form a drift region 350 and/or drain extension of the device. The doping procedure may include an n-type dopant implantation configured to define an n-type well. A drain-side of the gate structure 334 may be used to align the drift region 350 with the gate structure 334. The step 306 may include a drive procedure to achieve a desired depth and dopant concentration profile for the drift region 350.

Another n-type implant is conducted in a step 308 to form source and drain regions 340, 342. The gate structure 334 and/or another photoresist layer may be used as a mask to align the source region 340 with the source-side edge of the gate structure 334. The drain region 342 is spaced from the gate structure 334 as shown. The step 308 may include a photoresist masking process and a drive procedure to achieve a desired depth and dopant concentration profile for the source and drain regions 340, 342. The source region 340 is doped and configured such that the shunt region 356 is under the source region 340. One or more n-type ion implantation procedures may be performed. For example, formation of one or both of the source region 340 and the drain region 342 may include a moderate implant before formation of sidewall spacers of the gate structure 334 to create one or more transition regions (see, e.g., FIG. 1). A heavy implant after formation of the sidewall spacers may then be implemented to form the source and/or drain regions 340, 342 adjacent to such transition regions.

In a step 310, a number of metal and passivation layers are deposited. The metal layers may include one or more layers to form gate, source and drain electrodes 345, 346, as well as one or more layers to form a backside contact 366. A number of passivation layers 354 may be deposited to isolate and/or define the metal layers, including, for instance, a Faraday or other shield 352 along the gate structure 334.

Additional acts may be implemented at various points during the fabrication procedure. For example, one or more acts may be directed to defining an active area of the device. In some cases, such acts may include the formation of one or more device isolating wells, layers, or other regions. One or more metal layers may be deposited. Any number of additional STI regions may be formed. The procedures may be implemented in various orders. Additional or alternative procedures may be implemented.

The shunt region of the disclosed methods and devices may be used to increase the current capability of LDMOS devices (e.g., RF LDMOS devices). For example, in various embodiments, snapback current capability may be doubled, when compared with conventional devices. The voltage at which snapback occurs may also increase, when compared with conventional devices, as a result of the presence of the shunt region. The input power handling of the disclosed devices may also be improved, when compared with conventional devices, via the incorporation of the shunt region. Such improvements in performance capability and ruggedness may be achieved for a variety of device thicknesses (e.g., sinker depth), drain extension lengths, and shield dimensions.

In a first aspect, a device includes a semiconductor substrate, source and drain regions in the semiconductor substrate and having a first conductivity type, a gate structure supported by the semiconductor substrate between the source and drain regions, a well region in the semiconductor substrate, having a second conductivity type, and in which a channel region is formed under the gate structure during operation, and a shunt region adjacent the well region in the semiconductor substrate and having the second conductivity type. The shunt region has a higher dopant concentration than the well region to establish a shunt path for charge carriers of the second conductivity type that electrically couples the well region to a potential of the source region.

In a second aspect, an electronic apparatus includes a substrate and a transistor disposed in the substrate. The transistor includes first and second semiconductor regions having a first conductivity type, a third semiconductor region having a second conductivity type and in which a channel region is formed between the first and second semiconductor regions during operation, and a fourth semiconductor region having the second conductivity type. The fourth semiconductor region has a higher dopant concentration than the third semiconductor region to establish a shunt path for charge carriers of the second conductivity type that electrically couples the third semiconductor region to a potential of the first semiconductor region.

In a third aspect, a method of fabricating a transistor includes forming a gate structure of the transistor on a semiconductor substrate, forming a well region in the semiconductor substrate, the well region extending under the gate structure via lateral diffusion where a channel region is formed during operation, forming a shunt region in the semiconductor substrate adjacent the well region, and forming a source region in the semiconductor substrate such that the shunt region is under the source region. The shunt region has a higher dopant concentration than the well region to establish a shunt path that electrically couples the well region to a potential of the source region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
   a semiconductor substrate;
   source and drain regions in the semiconductor substrate and having a first conductivity type;
   a gate structure supported by the semiconductor substrate between the source and drain regions;
   a well region in the semiconductor substrate, having a second conductivity type, and in which a channel region is formed under the gate structure during operation; and
   a shunt region adjacent the well region in the semiconductor substrate and having the second conductivity type;
   wherein the shunt region has a higher dopant concentration than the well region to establish a shunt path for charge carriers of the second conductivity type that electrically couples the well region to a potential of the source region.

2. The device of claim 1, wherein the shunt region has a bottom deeper than a bottom of the well region.

3. The device of claim 1, wherein the shunt region is disposed under the source region such that the shunt path extends under the source region.

4. The device of claim 1, wherein the shunt region does not extend under the gate structure.

5. The device of claim 1, wherein the shunt region is aligned with a source-side of the gate structure.

6. The device of claim 1, wherein the shunt region is spaced from a source-side corner of the gate structure.

7. The device of claim 1, further comprising:
   a contact disposed on a backside of the semiconductor substrate; and
   a sinker region in the semiconductor substrate, having the second conductivity type, and configured to establish an electrical connection between the source region and the backside contact;
   wherein the shunt region is adjacent the sinker region such that the shunt path is electrically coupled to the backside contact.

8. The device of claim 1, wherein the shunt region is laterally spaced from a source-side edge of the gate structure.

9. The device of claim 1, wherein the shunt path is laterally oriented.

10. The device of claim 1, wherein the shunt region is configured to lower an effective base resistance of a parasitic bipolar transistor having the well region as a base region.

11. The device of claim 1, further comprising a drift region in the semiconductor substrate between the well region and the drain region and having the first conductivity type to allow charge carriers of the first conductivity type in the channel region to reach the drain region.

12. An electronic apparatus comprising:
    a substrate; and
    a transistor disposed in the substrate, the transistor comprising:
       first and second semiconductor regions having a first conductivity type;
       a third semiconductor region having a second conductivity type and in which a channel region is formed between the first and second semiconductor regions during operation;
       a fourth semiconductor region having the second conductivity type;
       wherein the fourth semiconductor region has a higher dopant concentration than the third semiconductor region to establish a shunt path for charge carriers of the second conductivity type, and wherein the shunt path electrically couples the third semiconductor region to a potential of the first semiconductor region.

13. The electronic apparatus of claim 12, wherein the fourth semiconductor region has a bottom deeper than a bottom of the third semiconductor region.

14. The electronic apparatus of claim 12, wherein the fourth semiconductor region does not extend under the channel region.

15. The electronic apparatus of claim 12, wherein the fourth semiconductor region extends under the first semiconductor region such that the shunt path extends under the first semiconductor region.

16. A method of fabricating a transistor, the method comprising:
   forming a gate structure of the transistor on a semiconductor substrate;
   forming a well region in the semiconductor substrate, the well region extending under the gate structure via lateral diffusion where a channel region is formed during operation;
   forming a shunt region in the semiconductor substrate adjacent the well region; and
   forming a source region in the semiconductor substrate such that the shunt region is under the source region;
   wherein the shunt region has a higher dopant concentration than the well region to establish a shunt path that electrically couples the well region to a potential of the source region.

17. The method of claim 16, wherein forming the shunt region comprises conducting an implantation of dopant, and driving the dopant such that the shunt region has a bottom deeper than a bottom of the well region.

18. The method of claim 16, wherein forming the shunt region comprises conducting an implantation of dopant that uses the gate structure as a mask.

19. The method of claim 18, further comprising depositing a spacer along a source-side sidewall of the gate structure such that a vertical boundary of the shunt region is laterally spaced from the source-side sidewall.

20. The method of claim 18, wherein the implantation of dopant is conducted at an angle with respect to vertical to laterally space the shunt region from a source-side corner of the gate structure.

* * * * *